(12) United States Patent
Morie et al.

(10) Patent No.: US 6,714,075 B2
(45) Date of Patent: Mar. 30, 2004

(54) VARIABLE GAIN AMPLIFIER AND FILTER CIRCUIT

(75) Inventors: Takashi Morie, Osaka (JP); Hirokuni Fujiyama, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/286,814

(22) Filed: Nov. 4, 2002

(65) Prior Publication Data

US 2003/0095005 A1 May 22, 2003

(30) Foreign Application Priority Data

Nov. 16, 2001 (JP) ........................................ 2001-351897

(51) Int. Cl.[7] .............................................. H03F 3/45
(52) U.S. Cl. ........................................ 330/254; 330/278
(58) Field of Search ................................. 330/254, 278

(56) References Cited

U.S. PATENT DOCUMENTS 5,510,738 A * 4/1996 Gorecki et al. ............. 330/254
5,523,721 A    6/1996 Segawa et al.
5,668,502 A * 9/1997 Rijns .......................... 330/254
6,456,158 B1 * 9/2002 Giuroiu ....................... 327/359

* cited by examiner

Primary Examiner—Nguyen Khanh Van
(74) Attorney, Agent, or Firm—McDermott, Will & Emery

(57) ABSTRACT

The variable gain amplifier of the invention includes an input node pair, a first output node pair, a voltage-current converter, a plurality of first resistances, a first current source, a second current source, a second output node pair, a third output node pair and a switch circuit. A differential signal supplied to the input node pair is amplified with a predetermined gain (first gain) and output from the second output node pair. The differential signal is also amplified with a gain (second gain) corresponding to the resistance value between one interconnection node and another interconnection node, among the interconnection nodes connecting the plurality of first resistances, connected to the third output node pair via the switch circuit, and output from the third output node pair. The second gain can be changed by changing the two interconnection nodes connected to the third output node pair via the switch circuit.

20 Claims, 9 Drawing Sheets

100

VARIABLE GAIN AMPLIFIER AND FILTER CIRCUIT

BACKGROUND OF THE INVENTION

The present invention relates to a variable gain amplifier and a filter circuit, and more particularly, to a single-input multi-output variable gain amplifier and a filter circuit provided with the same.

Read channel systems for DVDs and the like use a technology of shaping the waveform of a raw signal from a disc to read the signal correctly. The waveform shaping is often realized by adjusting the zero position of a filter. Therefore, a filter for waveform shaping used in read channel systems is required to have an adaptive waveform shaping function that permits waveform shaping optimum for each signal from a disc. To attain adaptive waveform shaping, the filter must have an adjusting function of rendering the zero position variable.

FIG. 10 is a block diagram of a conventional second-order bi-quad GMC filter capable of adjusting the zero position. The bi-quad GMC filter of FIG. 10 includes transconductors 71 and 72, capacitors 73 and 74 and amplifiers 75 and 76. The amplifiers 75 and 76 are provided for adjusting the zero position. The amplifier 75 outputs an input signal Vin to the transconductor 71 as it is (×1) without amplification. The amplifier 76 amplifies the input signal Vin by A times (×A) and outputs the amplified signal to the transconductor 72. The transfer function of the GMC filter of FIG. 10 is represented by expression:

$$\frac{V\text{out}}{V\text{in}} = \frac{gm(gm + sC1A)}{gm^2 + sC1gm + s^2C2C1} \quad (1)$$

where C1 and C2 are the capacitances of the capacitors 73 and 74, respectively, Vout is the output of the filter, and s is a Laplace variable. The zero position of the filter is represented by:

$$gm/(C1 \times A).$$

It is therefore found that the zero position of the filter can be adjusted by adjusting the gain A of the amplifier 76.

The above description is for generation of the first-order zero. For generation of a second- or higher-order zero, the same bi-quad GMC filters as that of FIG. 10 may be connected sequentially.

The amplifiers 75 and 76 used in the GMC filter of FIG. 10 are required to have ideal characteristics of being small in deterioration of the phase rotation and gain within the band of the filter, and thus, high-speed operation is necessary. To fulfill this requirement, the power consumption and circuit area of the amplifiers 75 and 76 tend to be large.

The input signal Vin to the filter is branched by the amplifiers 75 and 76, and the branched signals are input into the transconductors 71 and 72. It is desirable that the difference in delay time between the signal from the amplifier 75 and the signal from the amplifier 76 is zero idealistically. If there is a delay time difference between these signals, the transfer function will fail to have a form as represented by expression (1), and the characteristics will be deviated from the idealistic characteristics. In particular, the group delay characteristic will be deviated enormously. Since the amplifiers 75 and 76 shown in FIG. 10 are different in gain, the signal delay time tends to be deviated. As a result, the group delay error of the filter tends to be great.

SUMMARY OF THE INVENTION

An object of the present invention is providing a variable gain amplifier capable of reducing the circuit area.

Another object of the present invention is providing a filter circuit capable of reducing the group delay error.

According to one aspect of the present invention, the variable gain amplifier includes an input node pair, a first output node pair, a voltage-current converter, a plurality of first resistances, a first current source, a second current source, a second output node pair, a third output node pair and a switch circuit.

The input node pair receives a differential signal. The voltage-current converter outputs a differential current corresponding to a voltage between one and the other of the input node pair to the first output node pair. The plurality of first resistances are connected in series between one and the other of the first output node pair. The first current source is connected between a power supply node receiving the supply voltage and one of the first output node pair. The second current source is connected between the power supply node and the other of the first output node pair. The second output node pair receives a voltage at the first output node pair. The switch circuit connects an interconnection node among interconnection nodes connecting the plurality of first resistances to one of the third output node pair, and connects another interconnection node among the interconnection nodes connecting the plurality of first resistances to the other of the third output node pair.

In the variable gain amplifier described above, a differential signal supplied to the input node pair is amplified with a predetermined gain (first gain), and the amplified signal is output from the second output node pair. The differential signal is also amplified with a gain (second gain) corresponding to the resistance value between one interconnection node and another interconnection node, among the interconnection nodes connecting the plurality of first resistances, connected to the third output node pair via the switch circuit, and the amplified signal is output from the third output node pair. The second gain can be changed by changing the interconnection nodes connected to the third output node pair via the switch circuit. Thus, the variable gain amplifier described above has two functions as an amplifier having the first gain and as an amplifier having the second (variable) gain. Therefore, the circuit area can be reduced compared with the case of providing a first-gain amplifier and a second-gain amplifier separately, and thus the power consumption can be reduced.

The voltage at the second output node pair is a voltage at both ends of the plurality of first resistances, and the voltage at the third output node pair is a voltage at in-between positions of the plurality of first resistances. Therefore, the voltage at the second output node pair and the voltage at the third output node pair match in phase with each other. This reduces the difference between the signal delay in the path from the input node pair to the second output node pair and the signal delay in the path from the input node pair to the third output node pair, compared with the case of providing a first-gain amplifier and a second-gain amplifier separately.

Preferably, the voltage-current converter includes a first transistor, a second transistor, a third current source, a fourth current source and a second resistance.

The first transistor is connected between one of the first output node pair and a ground node receiving the ground voltage, and receives a voltage input via one of the input node pair at a gate function terminal. The second transistor is connected between the other of the first output node pair and the ground node, and receives a voltage input via the other of the input node pair at a gate function terminal. The third current source is connected in series with the first transistor between the one of the first output node pair and the ground node, and supplies a bias current to the first transistor. The fourth current source is connected in series with the second transistor between the other of the first output node pair and the ground node, and supplies a bias current to the second transistor. The second resistance is connected between a source function terminal of the first transistor and a source function terminal of the second transistor.

The gate function terminal corresponds to the gate when the first and second transistors are MOS transistors, and corresponds to the base when they are bipolar transistors. The drain function terminal corresponds to the drain when the first and second transistors are MOS transistors, and corresponds to the collector when they are bipolar transistors. The source function terminal corresponds to the source when the first and second transistors are MOS transistors, and corresponds to the emitter when they are bipolar transistors. These definitions of the gate function terminal, the drain function terminal and the source function terminal apply throughout the specification.

In the variable gain amplifier described above, the ratio of the output current/input voltage of the current-voltage converter is determined with the second resistance. The output current from the voltage-current converter is converted again into a voltage with the plurality of first resistances. Therefore, the gain (first gain) between the input node pair and the second output node pair can be roughly determined with the ratio of the first resistances to the second resistance. In addition, the differential signal is amplified with a gain (second gain) corresponding to the ratio of the resistance value between an interconnection node and another interconnection node, among the interconnection nodes connecting the plurality of first resistances, connected to the third output node pair, to the second resistance value, and the amplified signal is output from the third output node pair. This eliminates the necessity of a special circuit for gain adjustment, and as a result, the circuit scale can be reduced.

Preferably, the voltage-current converter includes a first transistor, a second transistor, a third transistor and a fourth transistor.

The first transistor is connected between one of the first output node pair and a ground node receiving the ground voltage, and receives a voltage input via one of the input node pair at a gate function terminal. The second transistor is connected between the other of the first output node pair and the ground node, and receives a voltage input via the other of the input node pair at a gate function terminal. The third transistor is connected in series with the first transistor between the one of the first output node pair and the ground node, and receives a predetermined bias at a gate function terminal. The fourth transistor is connected in series with the second transistor between the other of the first output node pair and the ground node, and receives a predetermined bias at a gate function terminal.

In the variable gain amplifier described above, the voltage-current converter is advantageously excellent in linearity. Therefore, a wide dynamic range is secured, and this allows handling of a large-amplitude signal. In addition, the gain of the variable gain amplifier can also be changed by changing the value of the bias applied to the gate function terminals of the third and fourth transistors.

Preferably, the switch circuit includes a plurality of first switch elements. The plurality of first switch elements are placed to correspond to the interconnection nodes connecting the plurality of first resistances for connecting/disconnecting the corresponding interconnection nodes to/from one or the other of the third output node pair.

In the variable gain amplifier described above, one of the first switch elements corresponding to an interconnection node, among the interconnection nodes connecting the plurality of first resistances, to be connected to one of the third output node pair is turned ON to connect the interconnection node in question to the one of the third output node pair. Also, one of the first switch elements corresponding to another interconnection node, among the interconnection nodes connecting the plurality of first resistances, to be connected to the other of the third output node pair is turned ON to connect the interconnection node in question to the other of the third output node pair.

Preferably, the variable gain amplifier further includes a second switch element and a third switch element. The second switch element is connected in the conducting state between one of the first output node pair and one of the second output node pair. The third switch element is connected in the conducting state between the other of the first output node pair and the other of the second output node pair.

In the variable gain amplifier described above, in which the second and third switch elements are provided, the difference in load between the second output node pair and the third output node pair can be reduced. This enables further reduction of the difference between the signal delay in the path from the input node pair to the second output node pair and the signal delay in the path from the input node pair to the third output node pair.

Preferably, the variable gain amplifier further includes a first capacitor and a second capacitor. The first capacitor is connected between one of the second output node pair and a ground node receiving the ground voltage. The second capacitor is connected between the other of the second output node pair and the ground node.

Preferably, the variable gain amplifier further includes a first capacitor and a second capacitor. The first capacitor is connected between one of the third output node pair and a ground node receiving the ground voltage. The second capacitor is connected between the other of the third output node pair and the ground node.

In the variable gain amplifier described above, in which the first and second capacitors are provided, the difference between the load capacitance connected to the second output node pair and the load capacitance connected to the third output node pair can be reduced. This enables further reduction of the difference between the signal delay in the path from the input node pair to the second output node pair and the signal delay in the path from the input node pair to the third output node pair.

According to another aspect of the present invention, the filter circuit is a GMC filter circuit including a plurality of transconductors and a plurality of capacitors. The plurality of capacitors are placed to correspond to the plurality of transconductors. The plurality of capacitors are connected between output nodes of the corresponding transconductors and a ground node receiving the ground voltage. The filter circuit further includes the variable gain amplifier described above. The plurality of transconductors include a first transconductor and a second transconductor. The first transconductor receives at an input a voltage from the second output node pair of the variable gain amplifier. The second transconductor receives at an input a voltage from the third output node pair of the variable gain amplifier.

In the filter circuit described above, in which the variable gain amplifier described above is used as an amplifier for adjusting the zero position, the circuit area can be reduced compared with conventional filter circuits.

In addition, since the variable gain amplifier can reduce the difference between the signal delay in the path from the input node pair to the second output node pair and the signal delay in the path from the input node pair to the third output node pair, deterioration in filter characteristics, in particular, deterioration in group delay can be minimized.

Preferably, one of the input node pair of the variable gain amplifier receives one of a differential input signal to be supplied to the filter circuit, and the other of the input node pair of the variable gain amplifier receives the other of the differential input signal to be supplied to the filter circuit.

Preferably, the plurality of transconductors include a third transconductor. One of the input node pair of the variable gain amplifier receives one of a differential output signal from the third transconductor, and the other of the input node pair of the variable gain amplifier receives the other of the differential output signal from the third transconductor.

According to yet another aspect of the present invention, the variable gain amplifier includes an input node pair, a first output node pair, a voltage-current converter, a plurality of first resistances, a first current source, a second current source, a second output node pair, a plurality of third output node pairs and a plurality of switch circuits.

The input node pair receives a differential signal. The voltage-current converter outputs a differential current corresponding to a voltage between one and the other of the input node pair to the first output node pair. The plurality of first resistances are connected in series between one and the other of the first output node pair. The first current source is connected between a power supply node receiving the supply voltage and one of the first output node pair. The second current source is connected between the power supply node and the other of the first output node pair. The second output node pair receives a voltage at the first output node pair. The plurality of switch circuits are placed to correspond to the plurality of third output node pairs. Each of the plurality of switch circuits connects one of the corresponding third output node pair to an interconnection node among interconnection nodes connecting the plurality of first resistances and connects the other of the corresponding third output node pair to another interconnection node among the interconnection nodes connecting the plurality of first resistances.

In the variable gain amplifier described above, a differential signal supplied to the input node pair is amplified with a predetermined gain (first gain), and the amplified signal is output from the second output node pair. The differential signal is also amplified with a gain (second gain) corresponding to the resistance value between one interconnection node and another interconnection node, among the interconnection nodes connecting the plurality of first resistances, connected to any of the third output node pairs corresponding to each of the switch circuits via the switch circuit in question, and the amplified signal is output from the third output node pair corresponding to the switch circuit in question. The second gain can be changed by changing either one or both of the interconnection nodes connected to any of the third output node pairs via the corresponding switch circuit. Thus, the variable gain amplifier described above has functions as an amplifier having the first gain and as a plurality of amplifiers having the second (variable) gains. Therefore, the circuit area can be reduced compared with the case of providing a first-gain amplifier and a plurality of second-gain amplifiers separately, and thus the power consumption can be reduced.

The voltage at the second output node pair is a voltage at both ends of the plurality of first resistances, and the voltages at the plurality of third output node pairs are voltages at in-between positions of the plurality of first resistances. Thus, the voltage at the second output node pair and the voltages at the plurality of third output node pairs match in phase with each other. This enables reduction of the difference between the signal delay in the path from the input node pair to the second output node pair and the signal delay in the path from the input node pair to each of the plurality of third output node pairs, compared with the case of providing a first-gain amplifier and a plurality of second-gain amplifiers separately.

Preferably, the voltage-current converter includes a first transistor, a second transistor, a third current source, a fourth current source and a second resistance.

The first transistor is connected between one of the first output node pair and a ground node receiving the ground voltage, and receives a voltage input via one of the input node pair at a gate function terminal. The second transistor is connected between the other of the first output node pair and the ground node, and receives a voltage input via the other of the input node pair at a gate function terminal. The third current source is connected in series with the first transistor between the one of the first output node pair and the ground node, and supplies a bias current to the first transistor. The fourth current source is connected in series with the second transistor between the other of the first output node pair and the ground node, and supplies a bias current to the second transistor. The second resistance is connected between a source function terminal of the first transistor and a source function terminal of the second transistor.

Preferably, the voltage-current converter includes a first transistor, a second transistor, a third transistor and a fourth transistor.

The first transistor is connected between one of the first output node pair and a ground node receiving the ground voltage, and receives a voltage input via one of the input node pair at a gate function terminal. The second transistor is connected between the other of the first output node pair and the ground node, and receives a voltage input via the other of the input node pair at a gate function terminal. The third transistor is connected in series with the first transistor between the one of the first output node pair and the ground node, and receives a predetermined bias at a gate function terminal. The fourth transistor is connected in series with the second transistor between the other of the first output node pair and the ground node, and receives a predetermined bias at a gate function terminal.

Preferably, each of the plurality of switch circuits includes a plurality of first switch elements. The plurality of first switch elements are placed to correspond to the interconnection nodes connecting the plurality of first resistances. Each of the plurality of first switch elements connects/disconnects the corresponding interconnection node to/from one or the other of the corresponding third output node pair.

In each of the switch circuits of the variable gain amplifier described above, one of the first switch elements corresponding to an interconnection node, among the interconnection nodes connecting the plurality of first resistances, to be connected to one of the third output node pair corresponding to the switch circuit in question is turned ON to connect the interconnection node in question to the one of the third output node pair. Also, one of the first switch elements corresponding to another interconnection node to be connected to the other of the third output node pair is turned ON to connect the interconnection node in question to the other of the third output node pair.

Preferably, the variable gain amplifier further includes a second switch element and a third switch element. The second switch element is connected between one of the first output node pair and one of the second output node pair in the conducting state. The third switch element is connected between the other of the first output node pair and the other of the second output node pair in the conducting state.

In the variable gain amplifier described above, in which the second and third switch elements are provided, the difference in load between the second output node pair and each of the plurality of third output node pairs can be reduced. This enables further reduction of the difference between the signal delay in the path from the input node pair to the second output node pair and the signal delay in the path from the input node pair to each of the plurality of third output node pairs.

Preferably, the variable gain amplifier further includes a first capacitor and a second capacitor. The first capacitor is connected between one of the second output node pair and a ground node receiving the ground voltage. The second capacitor is connected between the other of the second output node pair and the ground node.

Preferably, the variable gain amplifier further includes a plurality of first capacitors and a plurality of second capacitors. Each of the plurality of first capacitors is placed to correspond to one of the corresponding third output node pair among the plurality of third output node pairs. Each of the plurality of second capacitors is placed to correspond to the other of the corresponding third output node pair among the plurality of third output node pairs. Each of the plurality of first capacitors is connected between one of the corresponding third output node pair and a ground node receiving the ground voltage. Each of the plurality of second capacitors is connected between the other of the corresponding third output node pair and the ground node.

In the variable gain amplifier described above, in which the first and second capacitors are provided, the difference between the load capacitance connected to the second output node pair and the load capacitance connected to each of the plurality of third output node pairs can be reduced. This enables further reduction of the difference between the signal delay in the path from the input node pair to the second output node pair and the signal delay in the path from the input node pair to each of the plurality of third output node pairs.

According to yet another aspect of the present invention, the filter circuit is a GMC filter circuit including a plurality of transconductors and a plurality of capacitors. The plurality of capacitors are placed to correspond to the plurality of transconductors. The capacitors are connected between output nodes of the corresponding transconductors and a ground node receiving the ground voltage. The filter circuit further includes the variable gain amplifier described above. The plurality of transconductors include a first transconductor and a plurality of second transconductors. The first transconductor receives at an input a voltage from the second output node pair of the variable gain amplifier. The plurality of second transconductors correspond to the plurality of third output node pairs of the variable gain amplifier. Each of the plurality of second transconductors receives at an input a voltage from the corresponding third output node pair among the plurality of third output node pairs of the variable gain amplifier.

In the filter circuit described above, in which the variable gain amplifier described above is used as an amplifier for adjusting the zero position, the circuit area can be reduced compared with conventional filter circuits.

In addition, since the variable gain amplifier can reduce the difference between the signal delay in the path from the input node pair to the second output node pair and the signal delay in the path from the input node pair to each of the plurality of third output node pairs, deterioration in filter characteristics, in particular, deterioration in group delay can be minimized.

Preferably, one of the input node pair of the variable gain amplifier receives one of a differential input signal to be supplied to the filter circuit, and the other of the input node pair of the variable gain amplifier receives the other of the differential input signal to be supplied to the filter circuit.

Preferably, the plurality of transconductors include a third transconductor. One of the input node pair of the variable gain amplifier receives one of a differential output signal from the third transconductor, and the other of the input node pair of the variable gain amplifier receives the other of the differential output signal from the third transconductor.

DESCRIPTION OF THE PREFERRED EMBODIMENTS

Figure 1:
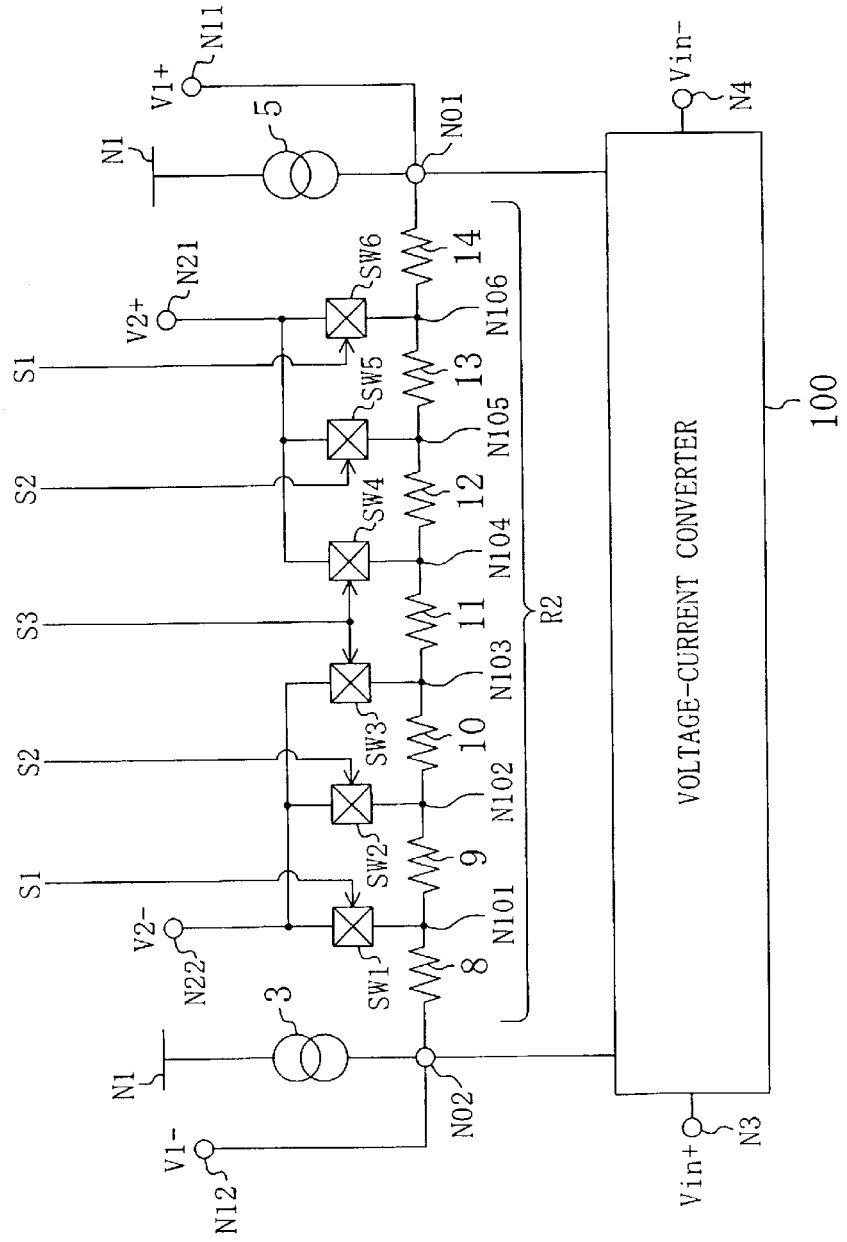
FIG. 1 illustrates a configuration of a variable gain amplifier of Embodiment 1 of the present invention.

Hereinafter, preferred embodiments of the present invention will be described in detail with reference to the accompanying drawings. Throughout the drawings, like components are denoted by the same reference numerals, and the description thereof is omitted here.

Embodiment 1

<Configuration of variable gain amplifier>

FIG. 1 illustrates a configuration of a variable gain amplifier of Embodiment 1, which is a single-input two-output amplifier. The variable gain amplifier of this embodiment is in a differential arrangement in which both the input and the output have positive and negative signals. The variable gain amplifier of FIG. 1 includes a voltage-current converter 100, current sources 3 and 5, resistances 8 to 14, switch elements SW1 to SW6, an input node pair (N3, N4) and output node pairs (N01, N02), (N11, N12) and (N21, N22).

The input node pair (N3, N4) receives a differential input signal (Vin$^+$, Vin$^-$).

The voltage-current converter 100 outputs a differential current corresponding to the voltage between the input nodes N3 and N4 to the output node pair (N01, N02).

The resistances 8 to 14 are connected in series between the output nodes N02 and N01. The serial resistance value of the resistances 8 to 14 is R2.

The current source 3 is connected between a power supply node N1 receiving the supply voltage and the output node N02. The current source 5 is connected between the power supply node N1 and the output node N01.

The output node pair (N11, N12) receives a voltage at the output node pair (N01, N02). The voltage at the output node pair (N11, N12) is output as a differential output signal (V1$^+$, V1$^-$).

The switch element SW1 is connected between an interconnection node N101 connecting the resistances 8 and 9 and the output node N22, and turned ON/OFF in response to a control signal S1. The switch element SW2 is connected between an interconnection node N102 connecting the resistances 9 and 10 and the output node N22, and turned ON/OFF in response to a control signal S2. The switch element SW3 is connected between an interconnection node N103 connecting the resistances 10 and 11 and the output node N22, and turned ON/OFF in response to a control signal S3. The switch element SW4 is connected between an interconnection node N104 connecting the resistances 11 and 12 and the output node N21, and turned ON/OFF in response to the control signal S3. The switch element SW5 is connected between an interconnection node N105 connecting the resistances 12 and 13 and the output node N21, and turned ON/OFF in response to the control signal S2. The switch element SW6 is connected between an interconnection node N106 connecting the resistances 13 and 14 and the output node N21, and turned ON/OFF in response to the control signal S1. The switch elements SW1 to SW6 constitute a switch circuit.

The voltage at the output node pair (N21, N22) is output as a differential output signal (V2$^+$, V2$^-$).

<Operation of variable gain amplifier>

The operation of the variable gain amplifier having the configuration described above will be described.

The differential signal (Vin$^+$, Vin$^-$) input at the input node pair (N3, N4) is amplified with an internal circuit and output from the output node pairs (N11, N12) and (N21, N22).

The voltage-current converter 100 converts the voltage (Vin$^+$, Vin$^-$) at the input node pair (N3, N4) into a current corresponding to the voltage. The current flows to the row of resistances 8 to 14, where the current is converted again into a voltage.

The circuit operates with such a simple mechanism. The voltage V1 resultantly applied at both ends of the row of resistances 8 to 14 is represented by expression:

$$V1 = (V1^+) - (V1^-) \quad (11)$$
$$= \{(Vin^+) - (Vin^-)\} \times R2 \times GM$$

where GM is the voltage-current conversion ratio of the voltage-current converter 100 and R2 is the serial resistance value of the resistances 8 to 14.

If setting is made so that the value of R2×GM is 1, expression (11) will be an expression representing the input-output relationship of an amplifier having a gain of 1. That is to say, an amplifier having a gain of 1 will be established in the relationship between the input node pair (N3, N4) and the output node pair (N11, N12).

The output node N21 is connected to the interconnection nodes N104 to N106 via the switch elements SW4 to SW6. The output node N22 is connected to the interconnection nodes N101 to N103 via the switch elements SW1 to SW3. The switch elements (SW1, SW6), (SW2, SW5) and (SW3, SW4) are respectively paired and turned ON/OFF in response to the control signals S1 to S3. One of the control signals S1 to S3 is asserted, turning ON the corresponding two switch elements. This connects one of the interconnection nodes N104 to N106 to the output node N21 and one of the interconnection nodes N101 to N103 to the output node N22. For example, when the control signal S1 is asserted while the control signals S2 and S3 are negated, the switch elements SW1 and SW6 are turned ON while the switch elements SW2 to SW5 are OFF. As a result, the interconnection node N106 is connected to the output node N21 and the interconnection node N101 is connected to the output node N22, while the interconnection nodes N102 to N105 are kept from connection to the output nodes N22 and N21. The voltage at the interconnection nodes connected to the output node pair (N21, N22) is output as the differential output signal (V2$^+$, V2$^-$). From this mechanism, the following expression is established.

$$(V2^+)-(V2^-)=\{(V1^+)-(V1^-)\} \times R3/R2 \quad (12)$$

where R3 is the resistance value between the interconnection nodes connected to the output node pair (N21, N22), which varies depending on the control signal asserted among the control signals S1 to S3. For example, when the control signal S1 is asserted while the control signals S2 and S3 are negated as described above, the interconnection nodes N106 and N101 are connected to the output nodes N21 and N22, respectively. The value of R3 at this time is therefore the serial resistance value of the resistances 9 to 13 existing between the interconnection nodes N101 and N106.

If setting is again made so that the value of R2×GM is 1, the output node pair (N21, N22) will be the output of an amplifier having a gain of R3/R2 (=A). The value of R3 is digitally controllable by controlling ON/OFF of the switch elements SW1 to SW6. That is to say, the output node pair (N21, N22) will be the output of a variable gain amplifier capable of digitally changing the gain A.

As described above, the variable gain amplifier of FIG. 1 is very simple in configuration and yet has two functions as being a 1× gain amplifier and a variable gain amplifier capable of digitally controlling the gain.

<Example 1 of voltage-current converter 100>

Figure 2:
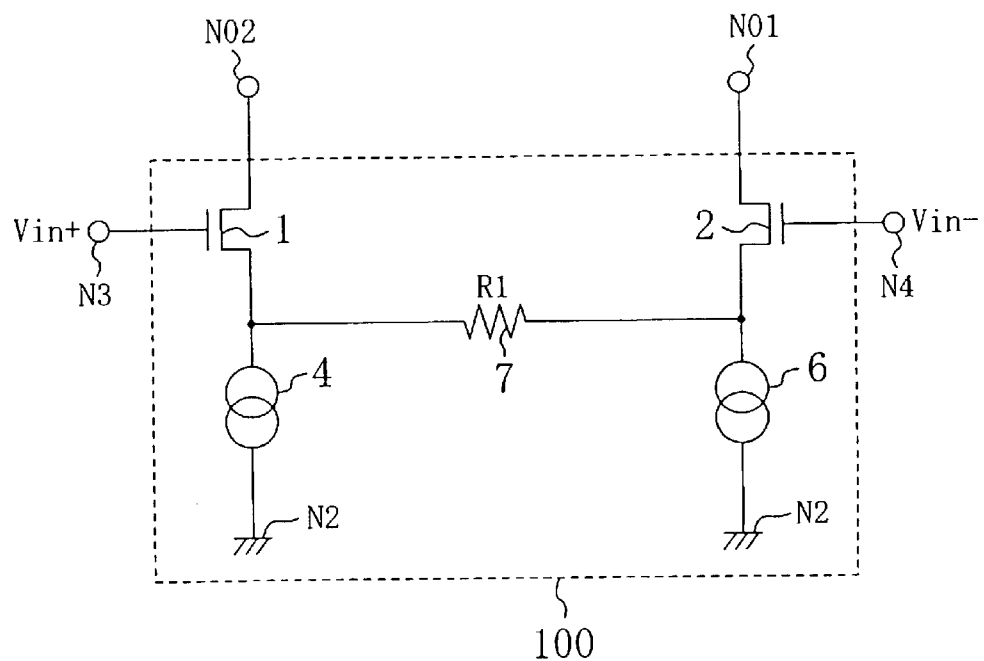
FIG. 2 illustrates an example of a voltage-current converter shown in FIG. 1.

An example of the voltage-current converter 100 is shown in FIG. 2. The voltage-current converter 100 of FIG. 2 includes n-channel MOS transistors 1 and 2, current sources 4 and 6 and a resistance 7.

The n-channel MOS transistor 1 and the current source 4 are connected in series between the output node N02 and a ground node N2 that receives the ground voltage. The signal (Vin$^+$) received at the input node N3 is applied to the gate of the n-channel MOS transistor 1. The current source 4 supplies a bias current to the n-channel MOS transistor 1.

The n-channel MOS transistor 2 and the current source 6 are connected in series between the output node N01 and the ground node N2. The signal (Vin$^-$) received at the input node N4 is applied to the gate of the n-channel MOS transistor 2. The current source 6 supplies a bias current to the n-channel MOS transistor 2.

The resistance 7, having a resistance value R1, is connected between the source of the n-channel MOS transistor 1 and the source of the n-channel MOS transistor 2.

The n-channel MOS transistors 1 and 2 serve as source followers, applying the voltage (Vin$^+$, Vin$^-$) applied at the input node pair (N3, N4) to both ends of the resistance 7 as it is. The voltage applied at both ends of the resistance 7 is converted into a current with the resistance value R1 of the resistance 7, and the current flows through the n-channel MOS transistors 1 and 2 to be output from the output node pair (N01, N02). The current-voltage conversion ratio GM is represented by expression:

$$GM=1/(R1+2/gm) \quad (13)$$

where gm is the gm value of the n-channel MOS transistors 1 and 2. From this, the voltage V1 applied at both ends of the row of resistances 8 to 14 is represented by expression:

$$V1 = (V1^+) - (V1^-) \quad (14)$$
$$= \{(Vin^+) - (Vin^-)\} \times R2/(R1+2/gm)$$

where R1 is the resistance value of the resistance 7 and R2 is the serial resistance value of the resistances 8 to 14. If setting is made so that the value of R2/(R1+2/gm) is 1, expression (14) will be an expression representing the input-output relationship of an amplifier having a gain of 1. That is to say, an amplifier having a gain of 1 will be established in the relationship between the input node pair (N3, N4) and the output node pair (N11, N12). Also, as represented by expression (12), the output node pair (N21, N22) will serve as the output of an amplifier having a gain of R3/R2 (=A).

<Example 2 of voltage-current converter 100>

Figure 3:
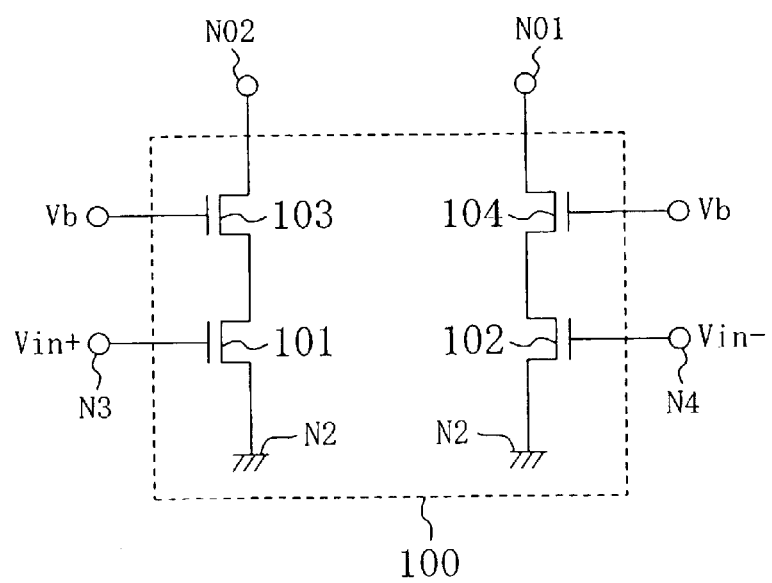
FIG. 3 illustrates another example of the voltage-current converter shown in FIG. 1.

Another example of the voltage-current converter 100 is shown in FIG. 3. The voltage-current converter 100 of FIG. 3 includes n-channel MOS transistors 101 to 104.

The n-channel MOS transistors 101 and 103 are connected in series between the output node N02 and a ground node N2. The signal (Vin$^+$) received at the input node N3 is applied to the gate of the n-channel MOS transistor 101. A predetermined bias Vb is applied to the gate of the n-channel MOS transistor 103.

The n-channel MOS transistors 102 and 104 are connected in series between the output node N01 and the ground node N2. The signal (Vin$^-$) received at the input node N4 is applied to the gate of the n-channel MOS transistor 102. The predetermined bias Vb is applied to the gate of the n-channel MOS transistor 104.

In the voltage-current converter 100 of this example, the n-channel MOS transistors 101 and 102 operate in the non-saturated region. The voltage-current conversion ratio GM of the voltage-current converter 100 is roughly obtained by expression:

$$GM=gm2 \times Vds \quad (15)$$

where gm2 is the transconductance of the n-channel MOS transistors 101 and 102 and Vds is the drain-source voltage of the n-channel MOS transistors 101 and 102. As is found from expression (15), the value of GM can be changed by changing the value of Vds.

The n-channel MOS transistors 103 and 104 serve as source followers, fixing the drain voltage of the n-channel MOS transistors 101 and 102 at a voltage lowered from the bias Vb by roughly the value of the threshold voltage. This indicates that the value of Vds can be changed by changing the value of the bias Vb. As a result, the value of GM can be changed by changing the value of the bias Vb.

The voltage V1 applied at both ends of the row of resistances 8 to 14 is represented by expression:

$$V1 = (V1^+) - (V1^-) \quad (16)$$
$$= \{(Vin^+) - (Vin^-)\} \times R2/(gm2 \times Vds)$$

If setting is made so that the value of R2/(gm2×Vds) is 1, expression (16) will be an expression representing the input-output relationship of an amplifier having a gain of 1. That is to say, an amplifier having a gain of 1 will be established in the relationship between the input node pair (N3, N4) and the output node pair (N11, N12). Also, as represented by expression (12), the output node pair (N21, N22) will serve as the output of an amplifier having a gain of R3/R2 (=A).

<Application To GMC Filter>

Figure 4:
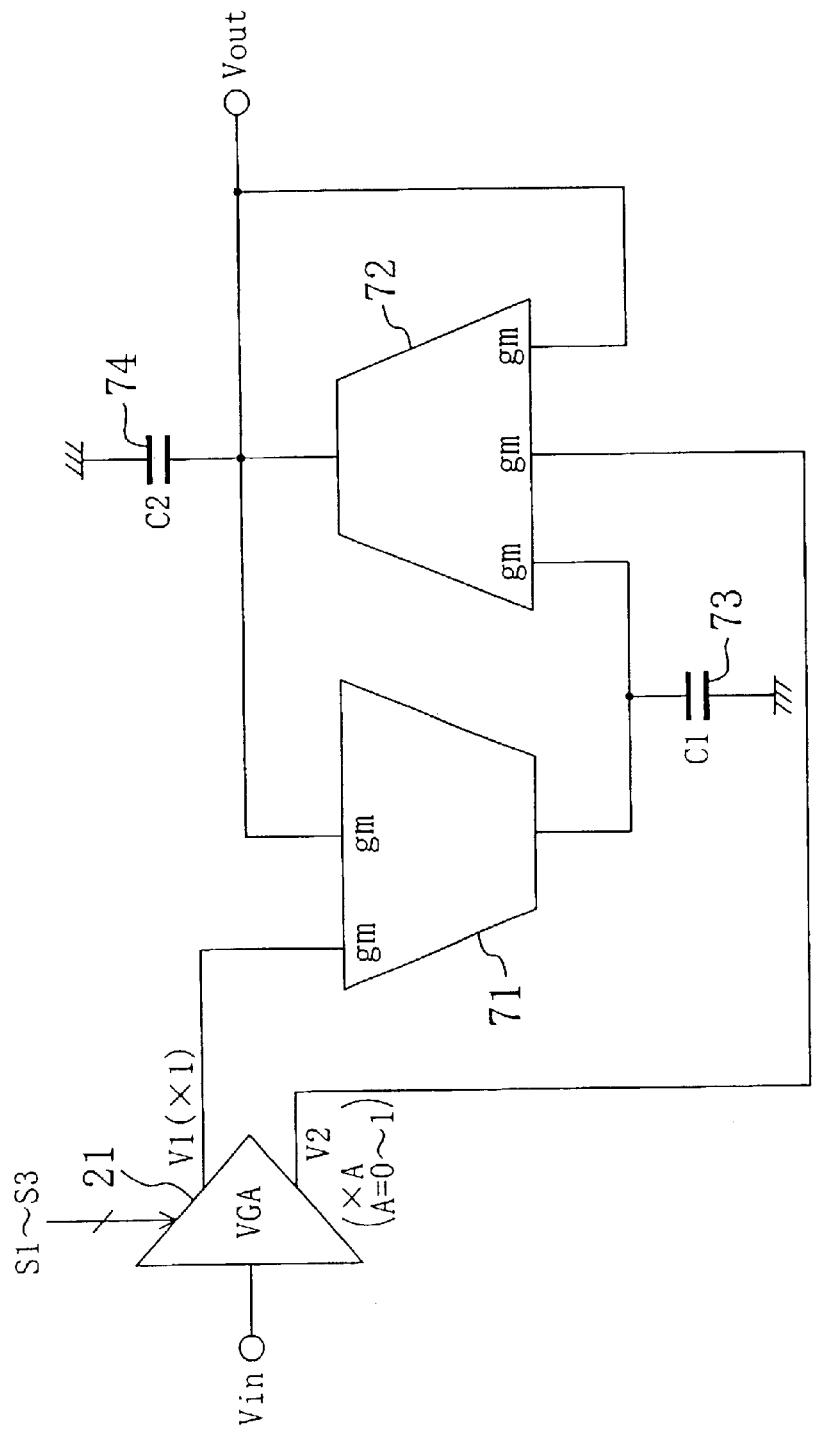
FIG. 4 is a block diagram of a second-order bi-quad GMC filter including the variable gain amplifier of FIG. 1.

FIG. 4 is a block diagram of a second-order bi-quad GMC filter including the variable gain amplifier of FIG. 1. In FIG. 4, a circuit of a single arrangement is shown for simplification of illustration. Actually, however, differential signal pairs composed of positive (+) and negative (−) signals are arranged for the signal lines. The GMC filter of FIG. 4 includes a variable gain amplifier 21, transconductors 71 and 72 and capacitors 73 and 74. The variable gain amplifier 21, which is the variable gain amplifier of FIG. 1, outputs the differential output signals V1 and V2 obtained by amplifying the differential input signal Vin by one and by A (A=R3/R2), respectively. Each of the transconductors 71 and 72, which are multi-input transconductors, sums currents proportional to the voltages input at its input terminals and outputs the summed result. The transconductor 71 outputs a current of the value corresponding to the sum of the value obtained by multiplying the output voltage V1 from the variable gain amplifier 21 by gm and the value obtained by multiplying an output voltage Vout of the filter by gm. The capacitor 73 is connected between the output node of the transconductor 71 and the ground node. The current output from the transconductor 71 is converted into a voltage by charging/discharging the capacitor 73. The transconductor 72 outputs a current of the value corresponding to the sum of the value obtained by multiplying the output voltage from the transconductor 71 by gm, the value obtained by multiplying the output voltage V2 from the variable gain amplifier 21 by gm, and the value obtained by multiplying the output voltage Vout of the filter by gm. The capacitor 74 is connected between the output node of the transconductor 72 and the ground node. The current output from the transconductor 72 is converted into a voltage by charging/discharging the capacitor 74. The output voltage of the transconductor 72 is the output voltage Vout of the filter.

Figure 10:
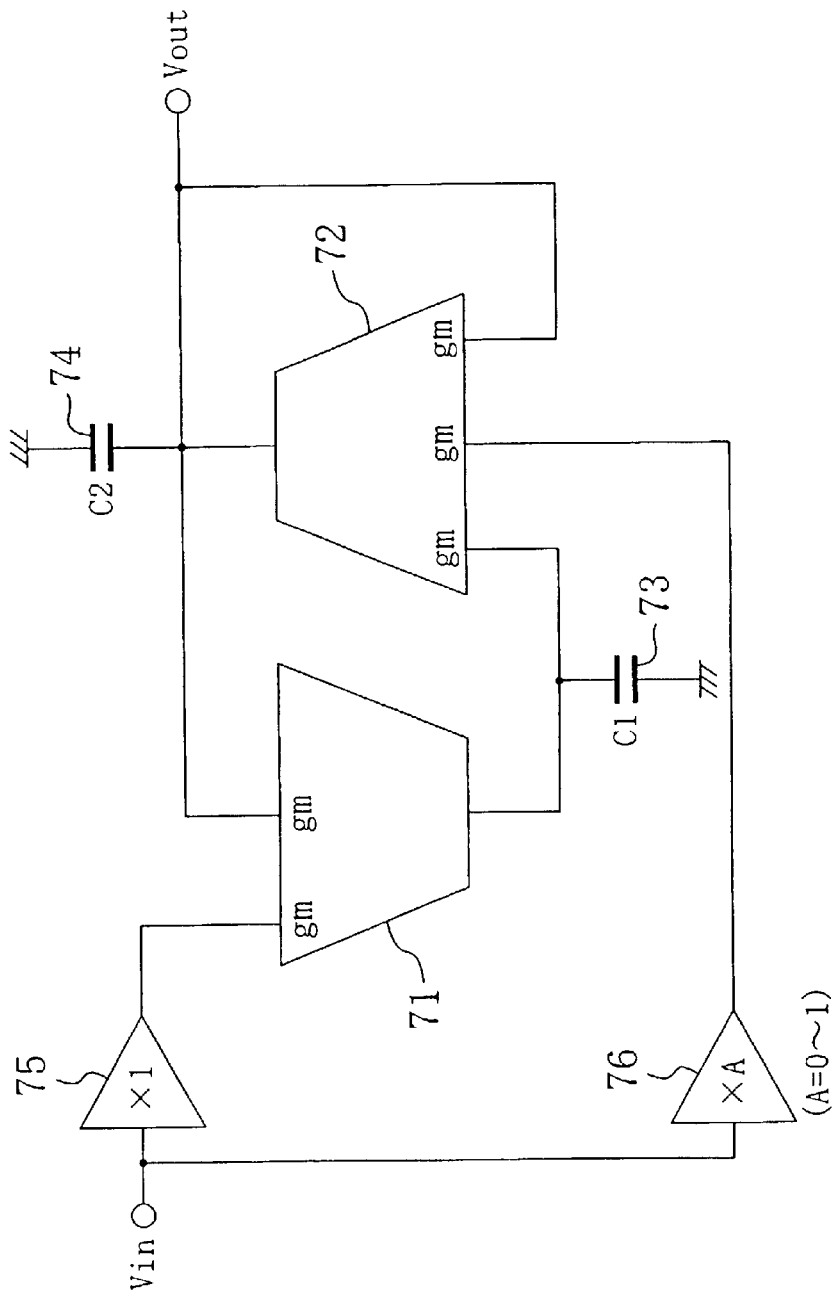
FIG. 10 is a block diagram of a conventional second-order bi-quad GMC filter.

By using the variable gain amplifier of FIG. 1, the conventional second-order bi-quad GMC filter (see FIG. 10) can be changed into a simplified configuration as shown in FIG. 4. The transfer function of the GMC filter of FIG. 4 perfectly matches with that represented by expression (1), and the same characteristics as those of the conventional GMC filter of FIG. 10 are attained.

<Effects>

The variable gain amplifier of Embodiment 1 of the present invention provides the following effects.

The variable gain amplifier of this embodiment has two functions as being a 1× gain amplifier and a variable gain amplifier capable of digitally controlling the gain. Therefore, the circuit area can be reduced compared with the case of providing two amplifiers separately, and thus the power consumption can be reduced.

As represented by expression (12), the (variable) gain between the input node pair (N3, N4) and the output node pair (N21, N22) is determined with the ratio of R3/R2. This makes the adjustment of the gain simple.

The output voltage ($V1^+$, $V1^-$) from the output node pair (N11, N12) and the output voltage ($V2^+$, $V2^-$) from the output node pair (N21, N22) match in phase with each other because they are voltages at both ends and intermediate positions, respectively, of the row of resistances 8 to 14. Therefore, the difference between the signal delay in the path from the input node pair (N3, N4) to the output node pair (N11, N12) and the signal delay in the path from the input node pair (N3, N4) to the output node pair (N21, N22) is reduced, compared with the case of providing a 1× gain amplifier and a variable gain amplifier separately. With this feature, a GMC filter using the variable gain amplifier of Embodiment 1 can minimize deterioration in filter characteristics, in particular, deterioration in group delay, compared with the conventional GMC filter of FIG. 10.

Due to the ability of digitally controlling the gain, the GMC filter using the variable gain amplifier of this embodiment exhibits good interface with a digital read channel block to be connected downstream.

When the voltage-current converter 100 of FIG. 2 is used, the gain between the input node pair (N3, N4) and the output node pair (N11, N12) is determined with R2/(R1+2/gm). If 2/gm is sufficiently small compared with R1, this expression approximates to R2/R1. This means that the gain between the input node pair (N3, N4) and the output node pair (N11, N12) can be adjusted with the resistance ratio. Thus, no extra gain adjusting mechanism is necessary to set the gain between the input node pair (N3, N4) and the output node pair (N11, N12). The gain between the input node pair (N3, N4) and the output node pair (N21, N22) is determined with the ratio of R3/R2 as described above. Therefore, adjustment of the gain can be made simple.

When the voltage-current converter 100 shown in FIG. 3 is used, the dynamic range of the variable gain amplifier can be widened due to the feature of the high linearity of the voltage-current converter 100. In addition, since the value of GM can be made variable by changing the value of the bias Vb, the gain between the input node pair (N3, N4) and the output node pair (N11, N12) can also be made variable.

<Alterations>

In this embodiment, the n-channel MOS transistors (1, 2), (101, 102) were used as the input differential pair. Alternatively, p-channel MOS transistors or bipolar transistors may be used.

The current sources 3 to 6 may be made of a simple circuit composed of one MOS transistor or a cascode circuit composed of a plurality of MOS transistors, or otherwise may be another type of current source improved in constant current property.

The center voltage of the output node pair (N11, N12), (N21, N22) may be kept constant by stabilizing the current amount of the current sources 3 to 6 with a common mode feedback circuit.

The switch elements SW1 to SW6 may be a simple switch made of an n-channel MOS transistor or a p-channel MOS transistor, or a CMOS switch.

In this embodiment, seven resistances 8 to 14 were provided between the output nodes N02 and N01, and the six switch elements SW1 to SW6 were provided to correspond to these resistances. The number of resistances and the number of switch elements are not limited to these, but may appropriately be determined depending on the gain adjustment range and the like.

In the above description, application of the variable gain amplifier of Embodiment 1 to the second-order bi-quad GMC filter was exemplified. Substantially the same effect can also be obtained by applying the variable gain amplifier to other types of GMC filters.

Embodiment 2

Figure 5:
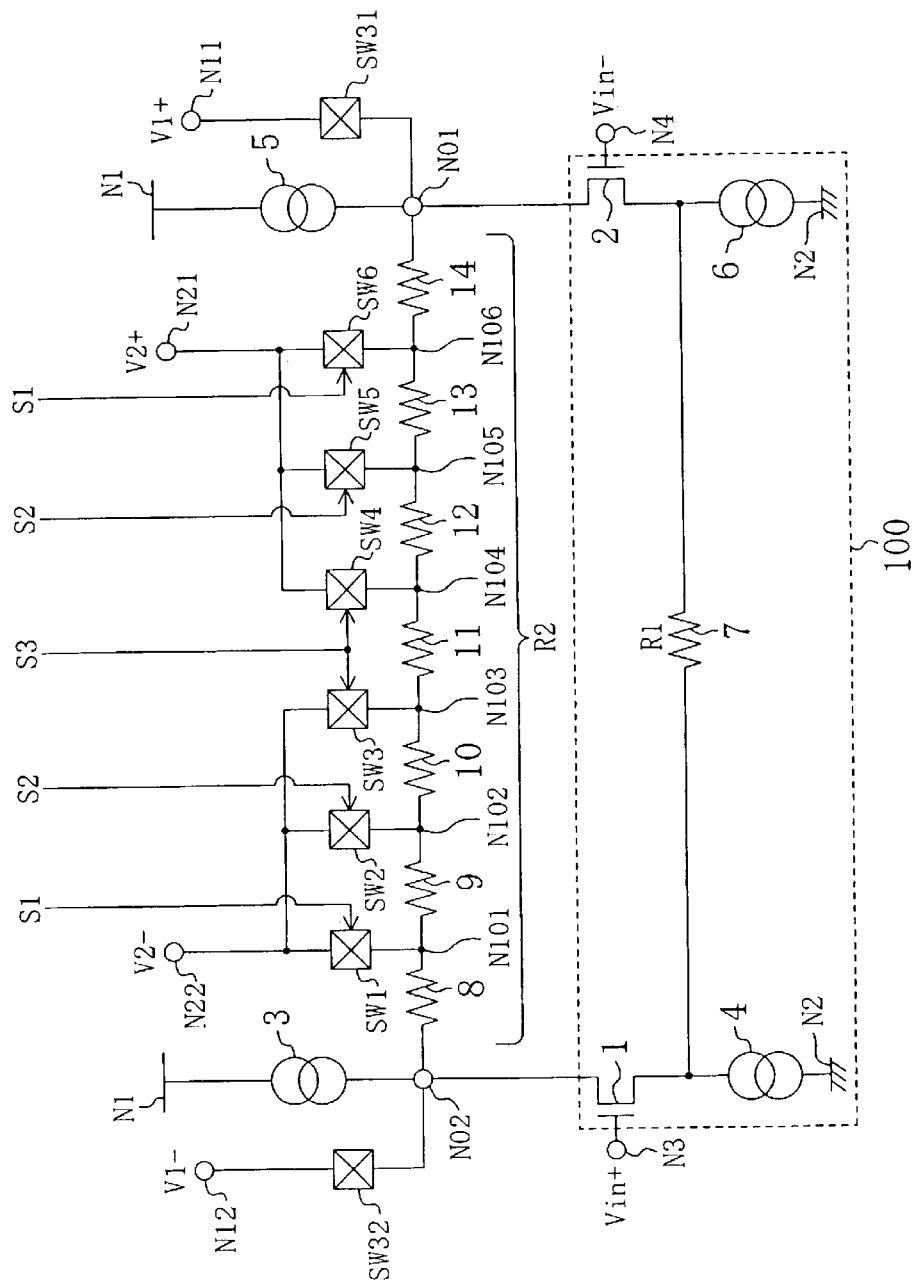
FIG. 5 illustrates a configuration of a variable gain amplifier of Embodiment 2 of the present invention.

FIG. 5 shows a configuration of a variable gain amplifier of Embodiment 2. The variable gain amplifier of FIG. 5 includes switch elements SW31 and SW32 in addition to the configuration of the variable gain amplifier of FIG. 1. The switch element SW31 is connected between the output node N01 and the output node N11 in the ON (conducting) state. The switch element SW32 is connected between the output node N02 and the output node N12 in the ON (conducting) state. In the illustrated example, the voltage-current converter 100 of FIG. 2 is used.

In the variable gain amplifier of FIG. 1, while the switch elements SW1 to SW6 are placed in the path from the input node pair (N3, N4) to the output node pair (N21, N22), no switch element is placed in the path from the input node pair (N3, N4) to the output node pair (N11, N12). In general, a switch element, which is a circuit composed of a transistor, has a parasitic resistance and a parasitic capacitance even in the ON state. A signal delay difference is therefore generated due to existence/absence of a switch element. In the variable gain amplifier of FIG. 5, however, in which the switch elements SW31 and SW32 in the ON state are placed in the path from the input node pair (N3, N4) to the output node pair (N11, N12), this signal delay difference due to existence/absence of a switch element can be suppressed.

Figure 6:
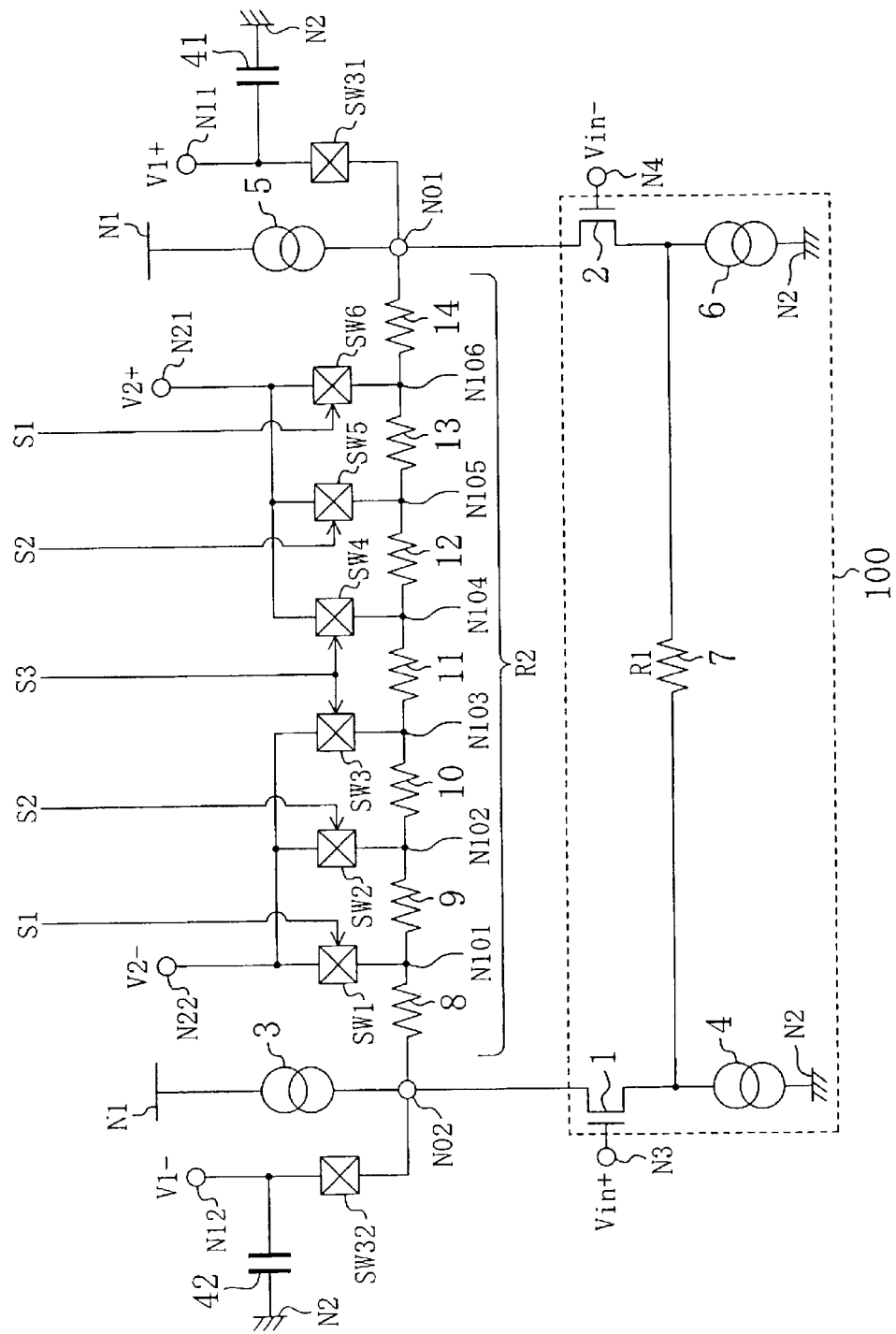
FIG. 6 illustrates a configuration of a variable gain amplifier in which the signal delay difference is further reduced.

FIG. 6 shows a configuration of a variable gain amplifier in which the signal delay difference is further reduced. The variable gain amplifier of FIG. 6 includes capacitors 41 and 42 in addition to the configuration of the variable gain amplifier of FIG. 5. The capacitor 41 is connected between the output node N11 and the ground node N2. The capacitor 42 is connected between the output node N12 and the ground node N2. In this variable gain amplifier, the capacitors 41 and 42 can compensate for a signal delay difference generated due to the difference between the load capacitance connected to the output node pair (N11, N12) and the load capacitance connected to the output node pair (N21, N22). Therefore, the signal delay difference can further be reduced.

In the variable gain amplifier of FIG. 6, the capacitors 41 and 42 are connected to the output node pair (N11, N12) because it is assumed that the parasitic capacitance at the output node pair (N11, N12) is smaller than the parasitic capacitance at the output node pair (N21, N22). If the parasitic capacitance at the output node pair (N21, N22) is smaller than the parasitic capacitance at the output node pair (N11, N12), the capacitors may be connected between the output node pair (N21, N22) and the ground node N2.

Embodiment 3

<Configuration of variable gain amplifier>

Figure 7:
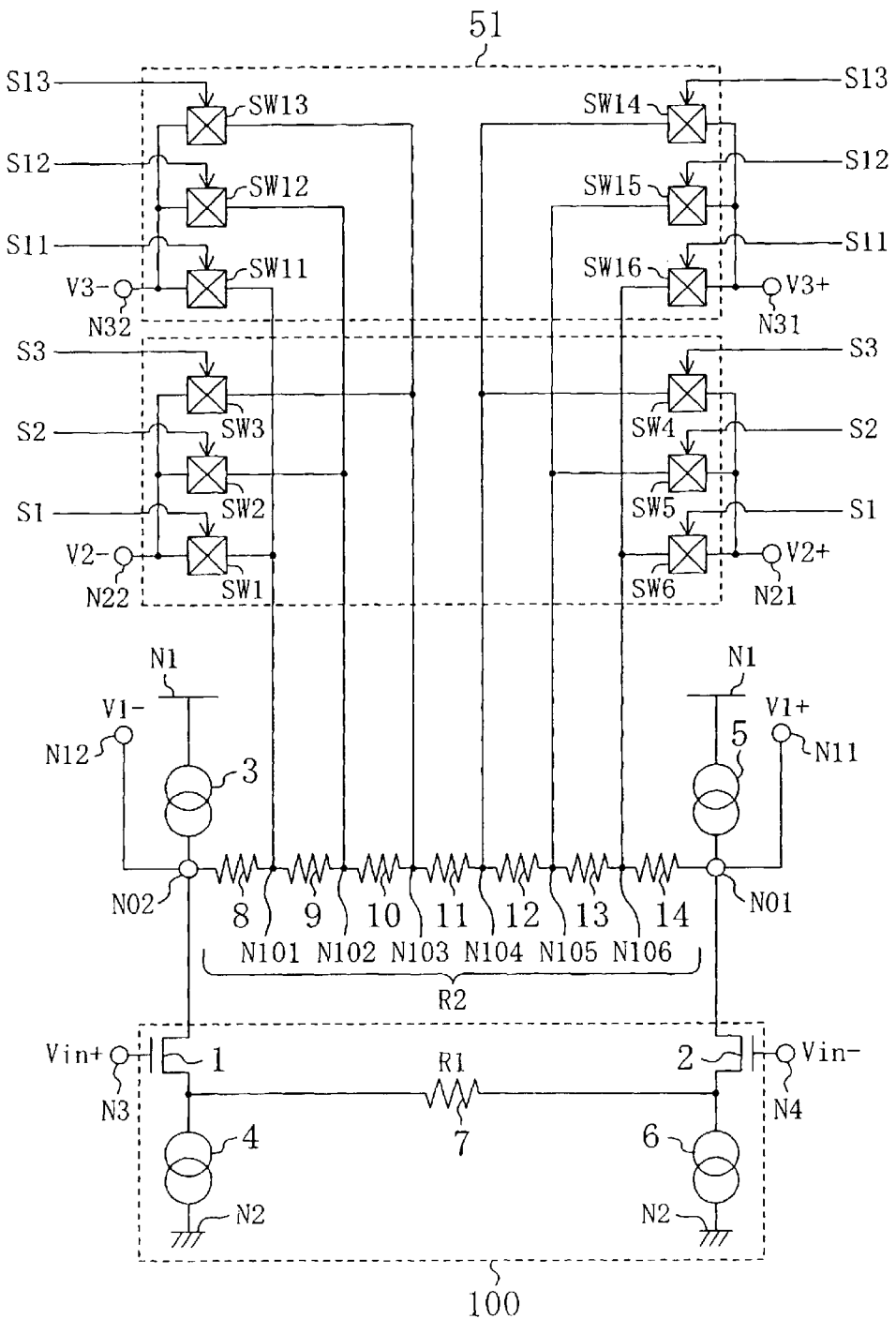
FIG. 7 illustrates a configuration of a variable gain amplifier of Embodiment 3 of the present invention.

FIG. 7 shows a configuration of a variable gain amplifier of Embodiment 3, which is a single-input three-output amplifier. The variable gain amplifier of FIG. 7 includes an output node pair (N31, N32) and a switch circuit 51 in addition to the configuration of the variable gain amplifier of FIG. 1. In the illustrated example, the voltage-current converter 100 of FIG. 2 is used.

The switch circuit 51 includes switch elements SW11 to SW16. The switch element SW11 is connected between the interconnection node N101 connecting the resistances 8 and 9 and the output node N32, and turned ON/OFF in response to a control signal S11. The switch element SW12 is connected between the interconnection node N102 connecting the resistances 9 and 10 and the output node N32, and turned ON/OFF in response to a control signal S12. The switch element SW13 is connected between the interconnection node N103 connecting the resistances 10 and 11 and the output node N32, and turned ON/OFF in response to a control signal S13. The switch element SW14 is connected between the interconnection node N104 connecting the resistances 11 and 12 and the output node N31, and turned ON/OFF in response to the control signal S13. The switch element SW15 is connected between the interconnection node N105 connecting the resistances 12 and 13 and the output node N31, and turned ON/OFF in response to the control signal S12. The switch element SW16 is connected between the interconnection node N106 connecting the resistances 13 and 14 and the output node N31, and turned ON/OFF in response to the control signal S11.

The voltage at the output node pair (N31, N32) is output as a differential output signal (V3$^+$, V3$^-$).

<Operation Of Variable Gain Amplifier>

As in Embodiment 1, the variable gain amplifier of FIG. 7 serves as an amplifier having a gain of 1 in the relationship between the input node pair (N3, N4) and the output node pair (N11, N12), and as a variable gain amplifier capable of digitally changing the gain in the relationship between the input node pair (N3, N4) and the output node pair (N21, N22).

The output node N31 is connected to the interconnection nodes N104 to N106 via the switch elements SW14 to SW16. The output node N32 is connected to the interconnection nodes N101 to N103 via the switch elements SW11 to SW13. The switch elements (SW11, SW16), (SW12, SW15) and (SW13, SW14) are respectively paired and turned ON/OFF in response to the control signals S11 to S13. One of the control signals S11 to S13 is asserted, turning ON the corresponding two switch elements. This connects one of the interconnection nodes N104 to N106 to the output node N31 and one of the interconnection nodes N101 to N103 to the output node N32. The voltage at the interconnection nodes connected to the output node pair (N31, N32) is output as the differential output signal (V3$^+$, V3$^-$). From this mechanism, the following expression is established.

$$(V3^+)-(V3^-)=\{(V1^+)-(V1^-)\}\times R4/R2 \qquad (17)$$

where R4 is the resistance value between the interconnection nodes connected to the output node pair (N31, N32), which varies depending on the control signal asserted among the control signals S11 to S13.

If setting is again made so that the value of R2×(R1+2/gm) is 1, the output node pair (N31, N32) will be the output of an amplifier having a gain of R4/R2 (=B). The value of R4 is digitally controllable by controlling ON/OFF of the switch elements SW11 to SW16. That is to say, the output node pair (N31, N32) can be the output of a variable gain amplifier capable of digitally changing the gain B. The control signals S11 to S13 are controlled independently of the control signals S1 to S3. Therefore, in the variable gain amplifier of FIG. 7, independent control is possible for the gain A between the differential input signal (Vin$^+$, Vin$^-$) and the differential output signal (V2$^+$, V2$^-$) and the gain B between the differential input signal (Vin$^+$, Vin$^-$) and the differential output signal (V3$^+$, V3$^-$).

As described above, the variable gain amplifier of FIG. 7 has three functions as being a 1× gain amplifier, a variable gain amplifier capable of digitally controlling the gain A, and a variable gain amplifier capable of digitally controlling the gain B.

The single-input three-output variable gain amplifier was described in this embodiment. It is also possible to implement a variable gain amplifier having four or more outputs by further providing a set or sets of an output node pair and a switch circuit similar to the output node pair (N31, N32) and the switch circuit 51.

<Application To GMC Filter>

Figure 8:
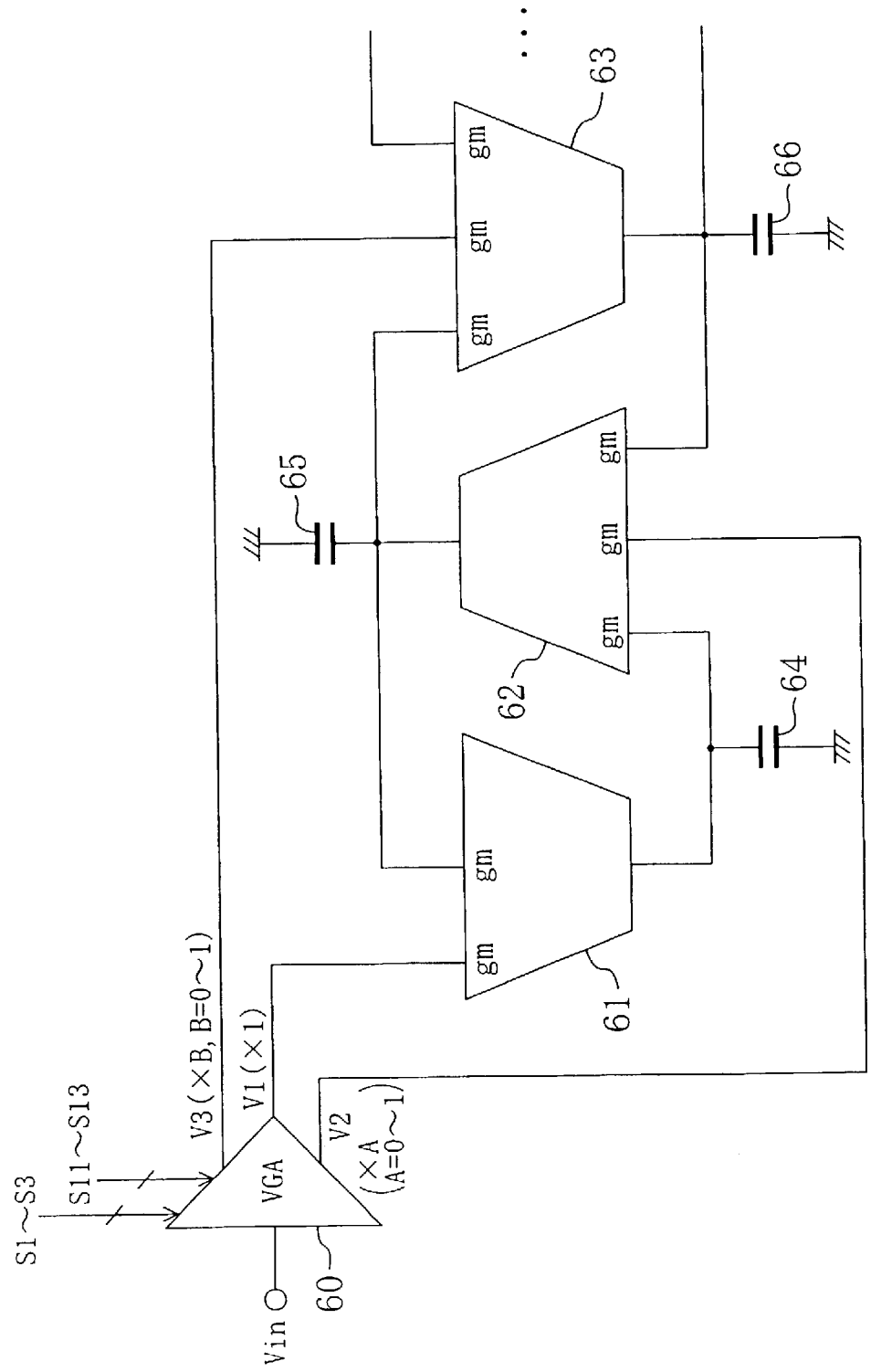
FIG. 8 is a block diagram of a ladder GMC filter including the variable gain amplifier of FIG. 7.

FIG. 8 is a block diagram of a ladder GMC filter (part) including the variable gain amplifier of FIG. 7. In FIG. 8, a circuit of a single arrangement is shown for simplification of illustration. Actually, however, differential signal pairs composed of positive (+) and negative (−) signals are arranged for the signal lines. The GMC filter of FIG. 8 includes a variable gain amplifier 60, transconductors 61 to 63 and capacitors 64 to 66. In FIG. 8, the rear-stage portion of the GMC filter is omitted, in which actually transconductors and capacitors are connected as in the front-stage portion shown in FIG. 8.

The variable gain amplifier 60, which is the variable gain amplifier of FIG. 7, outputs the differential output signals V1, V2 and V3 obtained by amplifying the differential input signal Vin by one, by A (R3/R2) and by B (R4/R2), respectively.

Each of the transconductors 61 to 63, which is a multi-input transconductor, sums currents proportional to the voltages input at its input terminals and outputs the summed result. The transconductor 61 outputs a current of the value corresponding to the sum of the value obtained by multiplying the output voltage V1 from the variable gain amplifier 60 by gm and the value obtained by multiplying the output voltage from the transconductor 62 by gm. The capacitor 64 is connected between the output node of the transconductor 61 and the ground node. The current output from the transconductor 61 is converted into a voltage by charging/discharging the capacitor 64. The transconductor 62 outputs a current of the value corresponding to the sum of the value obtained by multiplying the output voltage from the transconductor 61 by gm, the value obtained by multiplying the output voltage V2 from the variable gain amplifier 60 by gm, and the value obtained by multiplying the output voltage from the transconductor 63 by gm. The capacitor 65 is connected between the output node of the transconductor 62 and the ground node. The current output from the transconductor 62 is converted into a voltage by charging/discharging the capacitor 65. The transconductor 63 outputs a current of the value corresponding to the sum of the value obtained by multiplying the output voltage from the transconductor 62 by gm, the value obtained by multiplying the output voltage V3 from the variable gain amplifier 60 by gm, and the value obtained by multiplying the output voltage from a rear-stage transconductor (not shown) by gm. The capacitor 66 is connected between the output node of the transconductor 63 and the ground node. The current output from the transconductor 63 is converted into a voltage by charging/discharging the capacitor 66.

In the GMC filter of FIG. 8, the variable gain amplifier 60 receives the input signal Vin, generates the signals V1 to V3 by amplifying the input signal with different gains, and outputs the signals to the different transconductors 61 to 63. Therefore, the transfer function of the filter has a second-order numerator, in which coefficients in the zero-order, first-order and second-order terms can be arbitrarily set with the gains of the variable gain amplifier 60. This enables the waveform shaping in further variable ways. In the conventional GMC filter, three amplifiers are necessary to realize this function. However, in the GMC filter of FIG. 8, one variable gain amplifier 60 can fulfill this function. In general, by using an N-output variable gain amplifier, it is possible to provide a transfer function having an (N−1)-order numerator, in which coefficients in the respective order terms can be arbitrarily set. To realize this function, N amplifiers are necessary in the conventional GMC filter. However, by using the variable gain amplifier of the present invention, one variable gain amplifier can fulfill this function.

<Effects>

The variable gain amplifier of Embodiment 3 can obtain substantially the same effects as those obtained by the variable gain amplifier of Embodiment 1.

In addition, the signal delays of the plurality of output signals (V1+, V1−), (V2+, V2−) and (V3+, V3−) can be made to match with each other with further high precision by placing switch elements for the output node pairs (N11, N12) or by placing capacitances for a predetermined output node pair to make uniform the load capacitances connected to the output node pairs (N11, N12), (N21, N22) and (N31, N32), as described in Embodiment 2. Therefore, when a filter for waveform shaping is implemented using this variable gain amplifier, deterioration in filter characteristics, in particular, deterioration in group delay, can be reduced to a minimum.

<Alterations>

In this embodiment, the voltage-current converter 100 of FIG. 2 was used. Alternatively, the voltage-current converter 100 of FIG. 3 may be used.

The n-channel MOS transistors 1 and 2 were used as the input differential pair. Alternatively, p-channel MOS transistors or bipolar transistors may be used.

The current sources 3 to 6 may be made of a simple circuit composed of one MOS transistor or a cascode circuit composed of a plurality of MOS transistors, or otherwise may be another type of current source improved in constant current property.

The center voltage of the output node pair (N11, N12), (N21, N22), (N31, N32) may be kept constant by stabilizing the current amount of the current sources 3 to 6 with a common mode feedback circuit.

The switch elements SW1 to SW6 and SW11 to SW16 may be a simple switch made of an n-channel MOS transistor or a p-channel MOS transistor, or a CMOS switch.

In this embodiment, seven resistances 8 to 14 were provided between the output nodes N02 and N01, and two sets of six switch elements SW1 to SW6 and SW11 to SW16 were provided to correspond to these resistances. The number of resistances and the number of switch elements are not limited to these, but may appropriately be determined depending on the gain adjustment range and the like.

Figure 9:
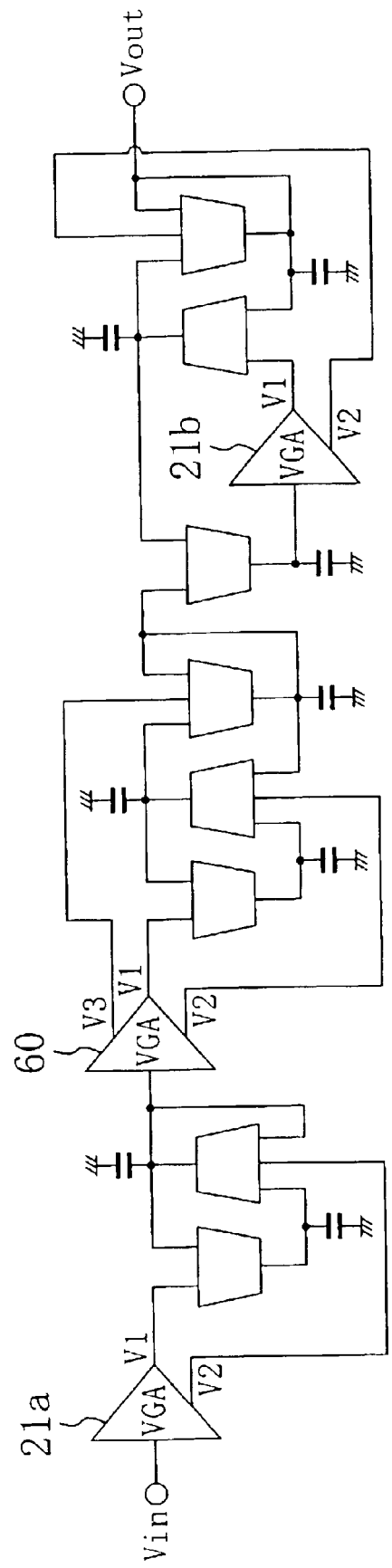
FIG. 9 is a block diagram of a GMC filter including the variable gain amplifiers of FIGS. 1 and 7.

The GMC filter of FIG. 8 is merely an example of GMC filters using the variable gain amplifier of FIG. 7. Substantially the same effect can also be obtained by applying the variable gain amplifier to GMC filters of other configurations. For example, the variable gain amplifier can be applied to a GMC filter having a configuration as shown in FIG. 9. The GMC filter of FIG. 9 includes both variable gain amplifiers 21a and 21b of the type shown in FIG. 1 and a variable gain amplifier 60 of the type shown in FIG. 7. In the GMC filters of FIGS. 4 and 8, the variable gain amplifier is placed at the input stage of the filter. However, in the GMC filter of FIG. 9, the gain amplifiers are placed not only at the input stage but also at in-between positions of the filter. The variable gain amplifier 21a receives the differential input signal Vin to be supplied to the GMC filter at the gates of the n-channel MOS transistors 1 and 2, while each of the variable gain amplifiers 21b and 60 receives a differential output signal from a transconductor constituting the GMC filter at the gates of the n-channel MOS transistors 1 and 2 (assuming that the voltage-current converter 100 of FIG. 2 is used).

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A variable gain amplifier comprising:
    an input node pair receiving a differential signal;
    a first output node pair;
    a voltage-current converter for outputting a differential current corresponding to a voltage between one and the other of the input node pair to the first output node pair;
    a plurality of first resistances connected in series between one and the other of the first output node pair;
    a first current source connected between a power supply node receiving the supply voltage and one of the first output node pair;
    a second current source connected between the power supply node and the other of the first output node pair;
    a second output node pair receiving a voltage at the first output node pair;
    a third output node pair; and
    a switch circuit for connecting an interconnection node among interconnection nodes connecting the plurality of first resistances to one of the third output node pair and connecting another interconnection node among the interconnection nodes connecting the plurality of first resistances to the other of the third output node pair.

2. The variable gain amplifier of claim 1, wherein the voltage-current converter comprises:
    a first transistor connected between one of the first output node pair and a ground node receiving the ground voltage for receiving a voltage input via one of the input node pair at a gate function terminal;
    a second transistor connected between the other of the first output node pair and the ground node for receiving a voltage input via the other of the input node pair at a gate function terminal;
    a third current source connected in series with the first transistor between the one of the first output node pair and the ground node for supplying a bias current to the first transistor;
    a fourth current source connected in series with the second transistor between the other of the first output node pair and the ground node for supplying a bias current to the second transistor; and a second resistance connected between a source function terminal of the first transistor and a source function terminal of the second transistor.

3. The variable gain amplifier of claim 1, wherein the voltage-current converter comprises:
   a first transistor connected between one of the first output node pair and a ground node receiving the ground voltage for receiving a voltage input via one of the input node pair at a gate function terminal;
   a second transistor connected between the other of the first output node pair and the ground node for receiving a voltage input via the other of the input node pair at a gate function terminal;
   a third transistor connected in series with the first transistor between the one of the first output node pair and the ground node for receiving a predetermined bias at a gate function terminal; and
   a fourth transistor connected in series with the second transistor between the other of the first output node pair and the ground node for receiving a predetermined bias at a gate function terminal.

4. The variable gain amplifier of claim 1, wherein the switch circuit includes a plurality of first switch elements placed to correspond to the interconnection nodes connecting the plurality of first resistances for connecting/disconnecting the corresponding interconnection nodes to/from one or the other of the third output node pair.

5. The variable gain amplifier of claim 4, further comprising:
   a second switch element in the conducting state connected between one of the first output node pair and one of the second output node pair; and
   a third switch element in the conducting state connected between the other of the first output node pair and the other of the second output node pair.

6. The variable gain amplifier of claim 1, further comprising:
   a first capacitor connected between one of the second output node pair and a ground node receiving the ground voltage; and
   a second capacitor connected between the other of the second output node pair and the ground node.

7. The variable gain amplifier of claim 1, further comprising:
   a first capacitor connected between one of the third output node pair and a ground node receiving the ground voltage; and
   a second capacitor connected between the other of the third output node pair and the ground node.

8. A GMC filter circuit comprising:
   a plurality of transconductors; and
   a plurality of capacitors placed to correspond to the plurality of transconductors, the capacitors being connected between output nodes of the corresponding transconductors and a ground node receiving the ground voltage,
   wherein the filter circuit further comprises the variable gain amplifier of claim 1, and
   the plurality of transconductors includes: a first transconductor receiving at an input a voltage from the second output node pair of the variable gain amplifier; and a second transconductor receiving at an input a voltage from the third output node pair of the variable gain amplifier.

9. The filter circuit of claim 8, wherein one of the input node pair of the variable gain amplifier receives one of a differential input signal to be supplied to the filter circuit, and the other of the input node pair of the variable gain amplifier receives the other of the differential input signal to be supplied to the filter circuit.

10. The filter circuit of claim 8, wherein the plurality of transconductors include a third transconductor, one of the input node pair of the variable gain amplifier receives one of a differential output signal from the third transconductor, and the other of the input node pair of the variable gain amplifier receives the other of the differential output signal from the third transconductor.

11. A variable gain amplifier comprising:
    an input node pair receiving a differential signal;
    a first output node pair;
    a voltage-current converter for outputting a differential current corresponding to a voltage between one and the other of the input node pair to the first output node pair;
    a plurality of first resistances connected in series between one and the other of the first output node pair;
    a first current source connected between a power supply node receiving the supply voltage and one of the first output node pair;
    a second current source connected between the power supply node and the other of the first output node pair;
    a second output node pair receiving a voltage at the first output node pair;
    a plurality of third output node pairs; and
    a plurality of switch circuits placed to correspond to the plurality of third output node pairs,
    wherein each of the plurality of switch circuits connects one of the corresponding third output node pair to an interconnection node among interconnection nodes connecting the plurality of first resistances and connects the other of the corresponding third output node pair to another interconnection node among the interconnection nodes connecting the plurality of first resistances.

12. The variable gain amplifier of claim 11, wherein the voltage-current converter comprises:
    a first transistor connected between one of the first output node pair and a ground node receiving the ground voltage for receiving a voltage input via one of the input node pair at a gate function terminal;
    a second transistor connected between the other of the first output node pair and the ground node for receiving a voltage input via the other of the input node pair at a gate function terminal;
    a third current source connected in series with the first transistor between the one of the first output node pair and the ground node for supplying a bias current to the first transistor;
    a fourth current source connected in series with the second transistor between the other of the first output node pair and the ground node for supplying a bias current to the second transistor; and
    a second resistance connected between a source function terminal of the first transistor and a source function terminal of the second transistor.

13. The variable gain amplifier of claim 11, wherein the voltage-current converter comprises:
    a first transistor connected between one of the first output node pair and a ground node receiving the ground voltage for receiving a voltage input via one of the input node pair at a gate function terminal;

a second transistor connected between the other of the first output node pair and the ground node for receiving a voltage input via the other of the input node pair at a gate function terminal;

a third transistor connected in series with the first transistor between the one of the first output node pair and the ground node for receiving a predetermined bias at a gate function terminal; and a fourth transistor connected in series with the second transistor between the other of the first output node pair and the ground node for receiving a predetermined bias at a gate function terminal.

14. The variable gain amplifier of claim 11, wherein each of the plurality of switch circuits includes a plurality of first switch elements placed to correspond to the interconnection nodes connecting the plurality of first resistances, and each of the plurality of first switch elements connects/disconnects the corresponding interconnection node to/from one or the other of the corresponding third output node pair.

15. The variable gain amplifier of claim 14, further comprising:

a second switch element in the conducting state connected between one of the first output node pair and one of the second output node pair; and a third switch element in the conducting state connected between the other of the first output node pair and the other of the second output node pair.

16. The variable gain amplifier of claim 11, further comprising:

a first capacitor connected between one of the second output node pair and a ground node receiving the ground voltage; and a second capacitor connected between the other of the second output node pair and the ground node.

17. The variable gain amplifier of claim 11, further comprising:

a plurality of first capacitors each placed to correspond to one of the corresponding third output node pair among the plurality of third output node pairs; and a plurality of second capacitors each placed to correspond to the other of the corresponding third output node pair among the plurality of third output node pairs, wherein each of the plurality of first capacitors is connected between one of the corresponding third output node pair and a ground node receiving the ground voltage, and each of the plurality of second capacitors is connected between the other of the corresponding third output node pair and the ground node.

18. A GMC filter circuit comprising:

a plurality of transconductors; and a plurality of capacitors placed to correspond to the plurality of transconductors, the capacitors being connected between output nodes of the corresponding transconductors and a ground node receiving the ground voltage, wherein the filter circuit further comprises the variable gain amplifier of claim 11, the plurality of transconductors include: a first transconductor receiving at an input a voltage from the second output node pair of the variable gain amplifier; and a plurality of second transconductors corresponding to the plurality of third output node pairs of the variable gain amplifier, and each of the plurality of second transconductors receives at an input a voltage from the corresponding third output node pair among the plurality of third output node pairs of the variable gain amplifier.

19. The filter circuit of claim 18, wherein one of the input node pair of the variable gain amplifier receives one of a differential input signal to be supplied to the filter circuit, and the other of the input node pair of the variable gain amplifier receives the other of the differential input signal to be supplied to the filter circuit.

20. The filter circuit of claim 18, wherein the plurality of transconductors include a third transconductor, one of the input node pair of the variable gain amplifier receives one of a differential output signal from the third transconductor, and the other of the input node pair of the variable gain amplifier receives the other of the differential output signal from the third transconductor.

* * * * *